United States Patent
Xia et al.

(10) Patent No.: US 8,094,486 B2
(45) Date of Patent: Jan. 10, 2012

(54) PAD DESIGN WITH BUFFERS FOR STT-MRAM OR OTHER SHORT PULSE SIGNAL TRANSMISSION

(75) Inventors: William Xia, San Diego, CA (US); Seung H. Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 138 days.

(21) Appl. No.: 12/363,871

(22) Filed: Feb. 2, 2009

(65) Prior Publication Data

US 2009/0290409 A1    Nov. 26, 2009

Related U.S. Application Data

(63) Continuation-in-part of application No. 12/125,113, filed on May 22, 2008, now abandoned.

(51) Int. Cl.
G11C 11/00 (2006.01)
G11C 5/08 (2006.01)
G11C 11/50 (2006.01)

(52) U.S. Cl. ............... 365/158; 365/66; 365/189.02; 365/164

(58) Field of Classification Search ............ 365/158, 365/66, 189.02, 164
See application file for complete search history.

(56) References Cited

U.S. PATENT DOCUMENTS

| | | | |
|---|---|---|---|
| 6,909,196 B2 | 6/2005 | Batra et al. | |
| 6,933,547 B2 | 8/2005 | Catalasan et al. | |
| 7,466,621 B2 * | 12/2008 | Lee | 365/230.06 |
| 7,746,921 B1 * | 6/2010 | Wik | 375/218 |
| 2001/0024449 A1 | 9/2001 | Lundby et al. | |
| 2002/0186598 A1 * | 12/2002 | Ooishi | 365/200 |
| 2003/0234448 A1 | 12/2003 | Batra et al. | |
| 2004/0001368 A1 | 1/2004 | Huggins | |
| 2004/0113175 A1 | 6/2004 | Motoyoshi et al. | |
| 2005/0088876 A1 * | 4/2005 | Fulkerson et al. | 365/173 |
| 2006/0028853 A1 * | 2/2006 | Osada et al. | 365/63 |
| 2008/0239799 A1 * | 10/2008 | Watanabe | 365/163 |
| 2008/0239811 A1 * | 10/2008 | Tanaka | 365/185.11 |
| 2009/0290406 A1 | 11/2009 | Xia et al. | |
| 2010/0097845 A1 * | 4/2010 | Sakimura et al. | 365/158 |

OTHER PUBLICATIONS

Zhao W et al: "Integration of spin-RAM technology in FPGA circuits" 8th International Conference on Solid-State and Integrated Circuit Technology, Shanghai, China, Oct. 23-26, 2006, pp. 799-802 (XP031045719).
International Search Report-PCT/US2009/043346, International Search Authority-European Patent Office Sep. 30, 2009.
Written Opinion-PCT/US2009/043346, International Search Authority-European Patent Office Sep. 30, 2009.

* cited by examiner

*Primary Examiner* — Ly D Pham
(74) *Attorney, Agent, or Firm* — Sam Talpalatsky; Nicholas J. Pauley; Jonathan T. Velasco (57) ABSTRACT

A Spin Transfer Torque Magnetoresistive Random Access Memory (STT-MRAM) bit cell array is provided. The STT-MRAM array includes a STT-MRAM bit cell and an input net coupled to the STT-MRAM bit cell. The STT-MRAM array includes a pulse signal input pad and a buffer coupled between the pulse signal input pad and the input net. In an aspect, the input net is one of a bit line, a word line, and a source line.

45 Claims, 7 Drawing Sheets

CONVENTIONAL ART

PAD DESIGN WITH BUFFERS FOR STT-MRAM OR OTHER SHORT PULSE SIGNAL TRANSMISSION

CLAIM OF PRIORITY UNDER 35 U.S.C. §120

The present Application for Patent is continuation-in-part of patent application Ser. No. 12/125,113 entitled "Low Loading Pad Design for STT-MRAM or Other Short Pulse Signal Transmission" filed May 22, 2008, pending, and assigned to the assignee hereof and hereby expressly incorporated by reference herein.

FIELD OF DISCLOSURE

Disclosed embodiment are related to structural designs for reducing capacitance in bonding pads for Magnetoresistive Random Access Memory (MRAM) bit cells. More particularly, the embodiments are related to structural designs of multi-stage buffers between the pads for Spin Transfer Torque Magnetoresistive Random Access Memory (STT-MRAM) bit cells and the input nets of the internal circuitries for STT-MRAM bit cells.

BACKGROUND

Magnetoresistive Random Access Memory (MRAM) is a non-volatile memory technology that uses magnetic elements. For example, Spin Transfer Torque Magnetoresistive Random Access Memory (STT-MRAM) uses electrons that become spin-polarized as the electrons pass through a thin film (spin filter). STT-MRAM is also known as Spin Transfer Torque RAM (STT-RAM), Spin Torque Transfer Magnetization Switching RAM (Spin-RAM), and Spin Momentum Transfer (SMT-RAM).

Figure 1:
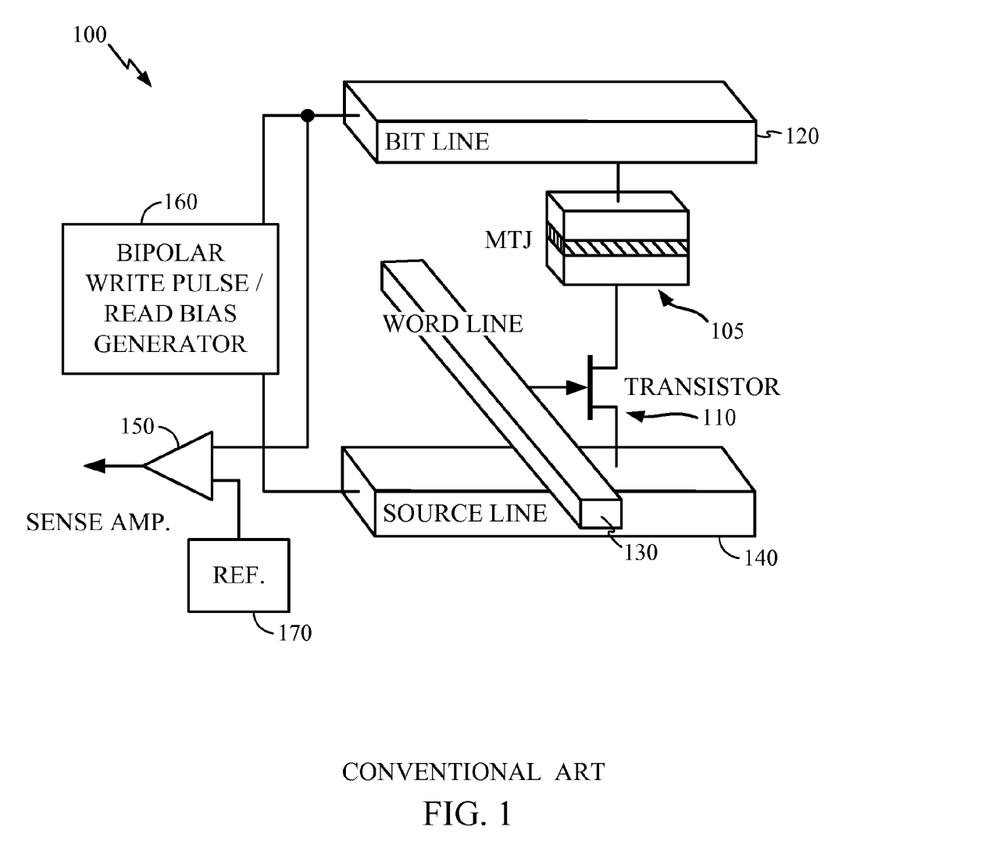
FIG. 1 illustrates a conventional Spin Transfer Torque Magnetoresistive Random Access Memory (STT-MRAM) cell.

Referring to FIG. 1, a diagram of a conventional STT-MRAM cell 100 is illustrated. The STT-MRAM bit cell 100 includes magnetic tunnel junction (MTJ) storage element 105, transistor 110, bit line 120 and word line 130. The MTJ storage element is formed, for example, from a pinned layer and a free layer, each of which can hold a magnetic field, separated by an insulating (tunnel barrier) layer as illustrated in FIG. 1. The STT-MRAM bit cell 100 also includes a source line 140, sense amplifier 150, read/write circuitry 160 and bit line reference 170. The operation and construction of the memory cell 100 is known in the art and will not be discussed in detail herein. Additional details are provided, for example, in M. Hosomi, et al., A Novel Nonvolatile Memory with Spin Transfer Torque Magnetoresistive Magnetization Switching: Spin-RAM, proceedings of IEDM conference (2005), which is incorporated herein by reference in its entirety.

As shown in FIG. 1, the STT-MRAM cell 100 has a source line 140 that is connected via a pad (not shown) to the lower portion of the transistor 110. Conventional pad designs use large metal grid layers (arrays) or large metal plates which cover the entire pad area which lead to large capacitance from the probing pads, and therefore, lead to signal distortion and sometimes even lead to signal extinguishing particularly for short pulse signals or high frequency signals.

SUMMARY

The disclosed embodiments are related to structural designs for reducing capacitance in bonding pads for Magnetoresistive Random Access Memory (MRAM) bit cells. More particularly, the embodiments are related to structural designs of multi-stage buffers between the pads for Spin Transfer Torque Magnetoresistive Random Access Memory (STT-MRAM) bit cells and the input nets of the internal circuitries for STT-MRAM bit cells.

For example, an exemplary embodiment is directed to a Spin Transfer Torque Magnetoresistive Random Access Memory (STT-MRAM) array including a STT-MRAM bit cell, an input net coupled to the STT-MRAM bit cell, a pulse signal input pad, and a buffer circuit coupled between the pulse signal input pad and the input net of the STT-MRAM bit cell.

In another embodiment, a Spin Transfer Torque Magnetoresistive Random Access Memory (STT-MRAM) array includes a plurality of STT-MRAM bit cells, each coupled to one of a plurality of input nets, a pulse signal input pad, and a buffer circuit coupled between the pulse signal input pad and one of the plurality of input nets.

In yet another embodiment, a Spin Transfer Torque Magnetoresistive Random Access Memory (STT-MRAM) array includes a STT-MRAM bit cell, an input net coupled to the STT-MRAM bit cell, and a buffer circuit coupled to the input net. The buffer circuit is configured to receive a pulse signal from a pad and output a buffer signal to the input net.

Another exemplary embodiment is directed to a method of forming a Spin Transfer Torque Magnetoresistive Random Access Memory (STT-MRAM) array. The method includes forming a STT-MRAM bit cell, forming an input net coupled to the STT-MRAM bit cell, forming a pulse signal input pad, and forming a buffer circuit coupled between the pulse signal input pad and the input net.

Another exemplary embodiment is directed to a Spin Transfer Torque Magnetoresistive Random Access Memory (STT-MRAM) array comprising memory cell means for storing a polarized magnetic field, pulse signal input means for transmitting a first pulse signal, input net means for transmitting a second pulse signal to the memory cell means, and buffering means coupled between the pulse signal input means and the input net means for receiving and buffering the first pulse signal from the pulse signal input means and outputting the second pulse signal to the input net means.

Another exemplary embodiment is directed to a method of forming a Spin Transfer Torque Magnetoresistive Random Access Memory (STT-MRAM) array. The method can include step for forming a STT-MRAM bit cell, step for forming an input net coupled to the STT-MRAM bit cell, step for forming a pulse signal input pad, and step for forming a buffer circuit coupled between the pulse signal input pad and the input net.

BRIEF DESCRIPTION OF THE DRAWINGS

The accompanying drawings are presented to aid in the description of embodiments and are provided solely for illustration of the embodiments and not limitation thereof.

DETAILED DESCRIPTION

Aspects of the embodiments are disclosed in the following description and related drawings directed to such embodiments. Alternate embodiments may be devised without departing from the scope of the invention. Additionally, well-known elements used and applied in the embodiments will not be described in detail or will be omitted so as not to obscure the relevant details.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

The embodiments overcome the aforementioned problems with the conventional pad designs by reducing the impact associated with parasitic capacitance of a pad for Spin Transfer Torque Magnetoresistive Random Access Memory (STT-MRAM) bit cells. The embodiments can intensify or enhance the pulse signal from the pad to reduce the impact of the parasitic capacitance of the pad on the signal, particularly for short pulse signals or high frequency signals.

With reference to FIGS. 2-7, exemplary embodiments of structural designs for reducing capacitance in bonding pads for Magnetoresistive Random Access Memory (MRAM) bit cells, and more particularly, structural designs of multi-stage buffers between the pads for Spin Transfer Torque Magnetoresistive Random Access Memory (STT-MRAM) bit cells and the input nets of the internal circuitries for STT-MRAM bit cells, will now be described.

The exemplary embodiments recognize that probing or bonding pads are formed from relatively large amounts of metal, which lead to large capacitance from the probing or bonding pads. Such parasitic capacitance can lead to signal distortion and sometimes even lead to signal extinguishing particularly for short pulse signals or high frequency signals.

To solve these and other problems, the exemplary embodiments provide pad designs that include a buffer(s) or buffer circuit(s), such as a multi-stage buffer(s), placed between the probing or bonding pads and the input nets of the internal circuitries. Such buffers can improve pulse signal strengths and can improve impedance matching. The embodiments of the pads with buffers also can obtain better quality of signal transmission for short pulse signals or high frequency signals propagating from/to probing or bonding pads to/from the internal nets.

Figure 2:
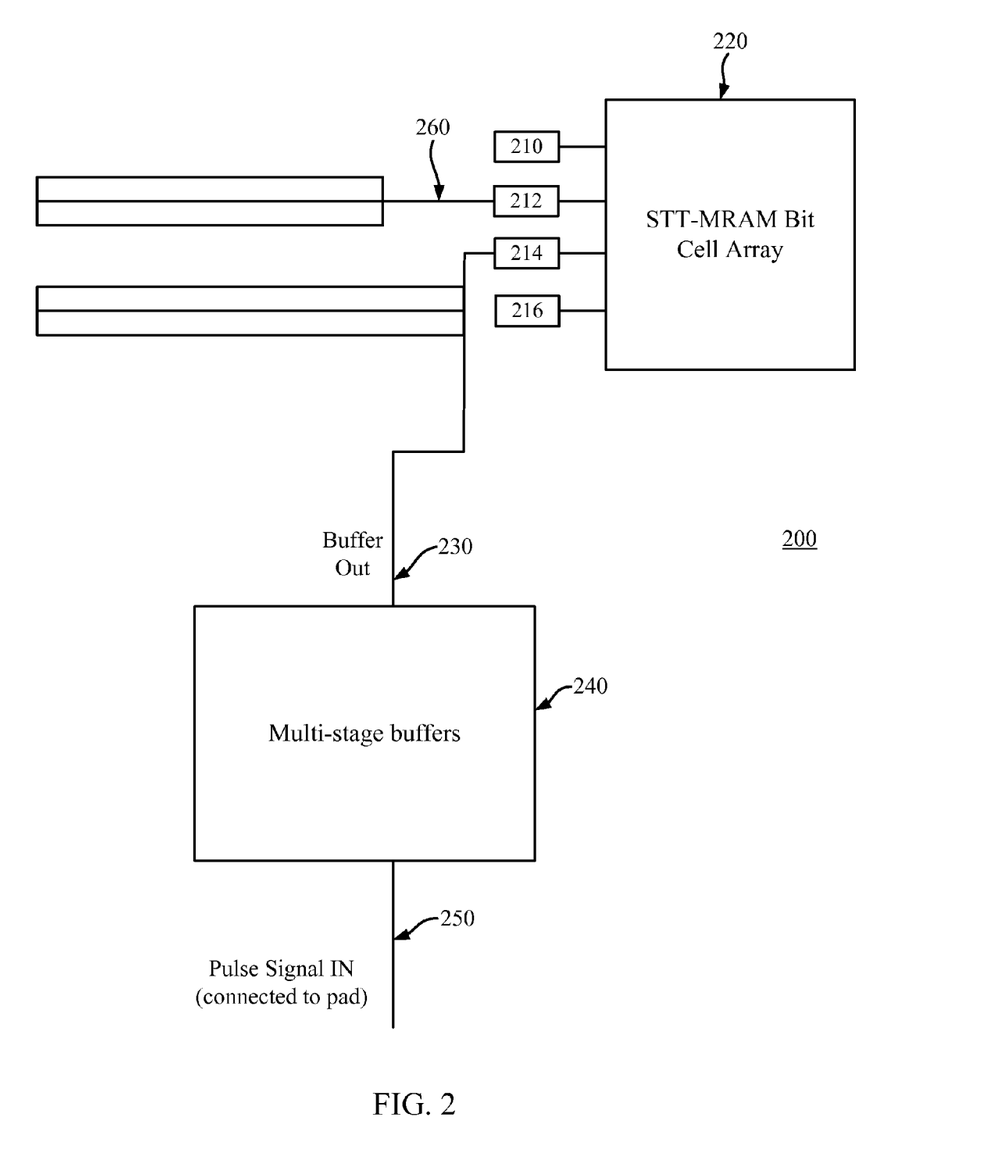
FIG. 2 is a top down view of a layout of multi-stage buffers.

FIG. 2 shows an STT-MRAM bit cell memory 200 having both a conventional metal connection to a word line compared to an exemplary embodiment having a buffer connecting the probing or bonding pad(s) (not shown) and word line(s). As shown in FIG. 2, the STT-MRAM array structure 220 has multiple word lines 210, 212, 214, 216, etc. (e.g., symmetric word lines) for controlling the STT-MRAM bit cells of the STT-MRAM bit cell array 220. A single word line conventionally controls a row of bit cells. The combination of each word line and a bit line is used to control each individual bit cell in the STT-MRAM bit cell array 220.

The upper portion of FIG. 2 shows a conventional metal connection 260 between the probing or bonding pads (not shown) and the word line 212. As described above, in the conventional arrangement, the parasitic capacitance of the probing or bonding pads can lead to signal distortion and sometimes even lead to signal extinguishing particularly for short pulse signals or high frequency signals. Such signal distortion and/or signal extinguishing can mean that the signal is unsatisfactory or too weak to drive the internal circuitries of the memory.

In order to limit or reduce the impact of the capacitance of the bonding pad, and thereby provide a signal that is satisfactory for driving the internal circuitries of the memory, an exemplary aspect recognizes that a buffer can be implemented to strengthen the pulse signal supplied from the pads to the internal circuitries. For example, in order to avoid the signal decay or distortion caused by the large capacitance of the pad, a buffer can be positioned between the pad and the internal circuitries of the memory. Accordingly, the buffer can strengthen the signal to be able to drive the internal circuitries of the memory.

For example, as shown in FIG. 2, the STT-MRAM bit cell memory 200 according to an exemplary embodiment includes a buffer 240 that receives a pulse signal from the probing or bonding pad (not shown) at a pulse signal IN 250. The buffer 240 outputs a buffer signal at a buffer output 230. The buffer signal is supplied to a word line 214, which controls a row of STT-MRAM bit cells in the STT-MRAM bit cell array 220. Since the word line 214 normally controls one row of memory, an embodiment of the buffer 240 controls one row of memory.

When the signal from the pad at pulse signal IN 250 is distorted or weakened because of the parasitic capacitance of the bonding pad, the buffer 240 can strengthen or enhance the signal at the buffer output 230 to be able to drive the word line 214 of the internal circuitries of the memory 200. Thus, the embodiment of a buffer positioned between the pad and the word line 214 reduces the impact from the parasitic capacitance from the pad.

For example, an exemplary embodiment is directed to a Spin Transfer Torque Magnetoresistive Random Access Memory (STT-MRAM) array including a plurality of STT-MRAM bit cells, each coupled to one of a plurality of bit lines, word lines, and source lines. As shown in FIG. 2, an embodiment includes a pulse signal input pad and a buffer 240 coupled between the pulse signal input pad and one of the plurality of word lines 214.

Figure 3:
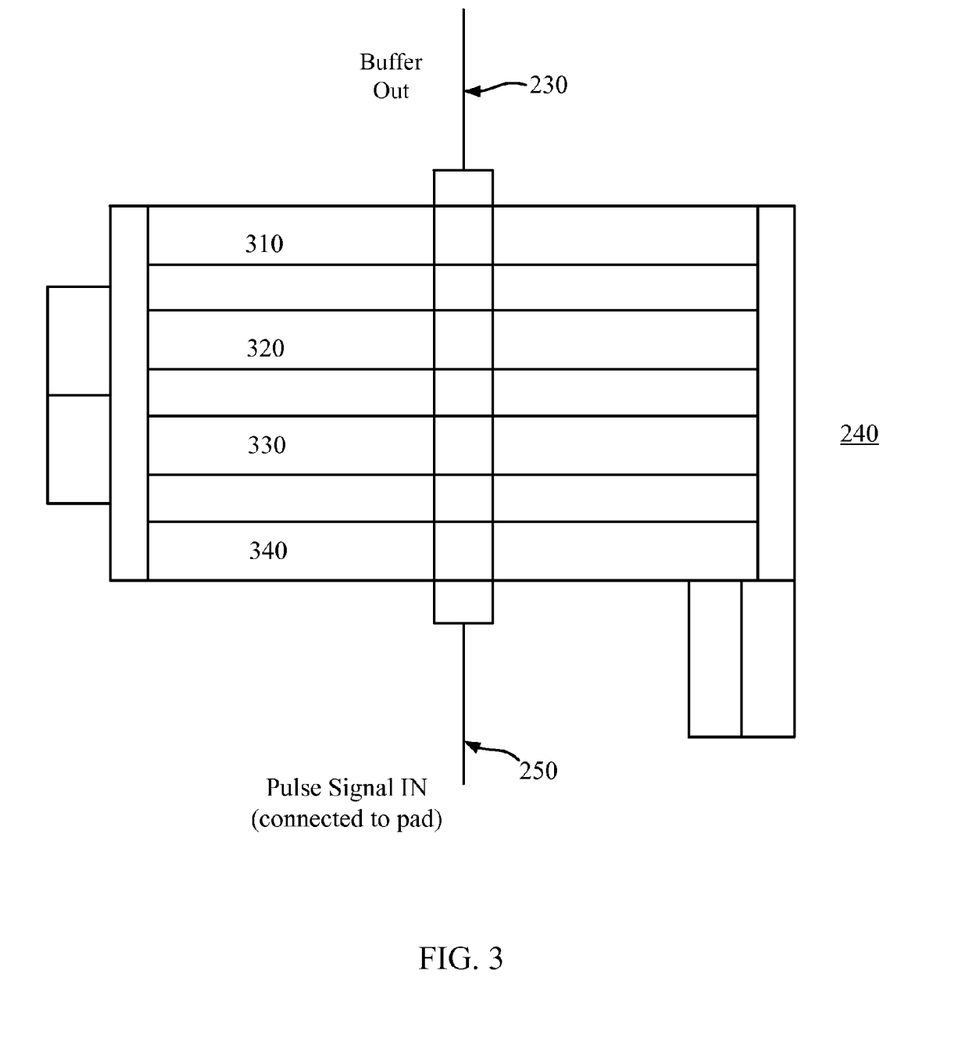
FIG. 3 is a partial layout of a multi-stage buffer.

According to exemplary embodiments, the buffer 240 can include a plurality of buffers (e.g., 310, 320, 330, and 340), as exemplarily illustrated in FIG. 3. The buffer 240 can include a multi-stage buffer, such as a 2-stage buffer, 4-stage buffer, 8-stage buffer, etc. Each buffer can be formed from one or more inverters. Depending on the affect of the capacitance of the pad on the pulse signal (e.g., the weakness or distortion of the pulse signal), a single-stage buffer may not be sufficient to overcome the impact of the pad on the signal and drive the internal circuitries of the memory. Therefore, in an exemplary embodiment, a multi-stage buffer can be implemented.

For example, as shown in FIG. 3, a four-stage buffer is positioned between the pad and the internal circuitries. The buffers can be formed from inverters. The exemplary multi-stage buffer can include a first buffer 310, second buffer 320, third buffer 330, and fourth buffer 340. The second buffer 320 can be, for example, twice as large as the first buffer 310, the third buffer 330 can be four times as large as the first buffer 310, and the fourth buffer 340 can be eight times as large as the first buffer 310.

One of ordinary skill in the art will recognize that the number and size of buffers provided can be selected based on the capacitive load of the pad and the affect of the pad on the pulse signal (i.e., the weakness or distortion of the pulse signal). Accordingly, other combinations of buffers, including different size and number of buffers, can be selected within the spirit and scope of the exemplary aspects based on these and other factors.

For example, the last buffer normally is selected such that the buffer can effectively drive the capacitive load of the pad. Thus, the multi-stage buffer can be a two-stage buffer, four-stage buffer, 8-stage buffer, or more, depending on the capacitive load of the pad. A higher capacitive load of the pad results in a weaker pulse signal, and therefore, a larger number or size of buffers will be required to reduce the affect of the parasitic capacitance of the pad on the pulse signal.

Figure 4:
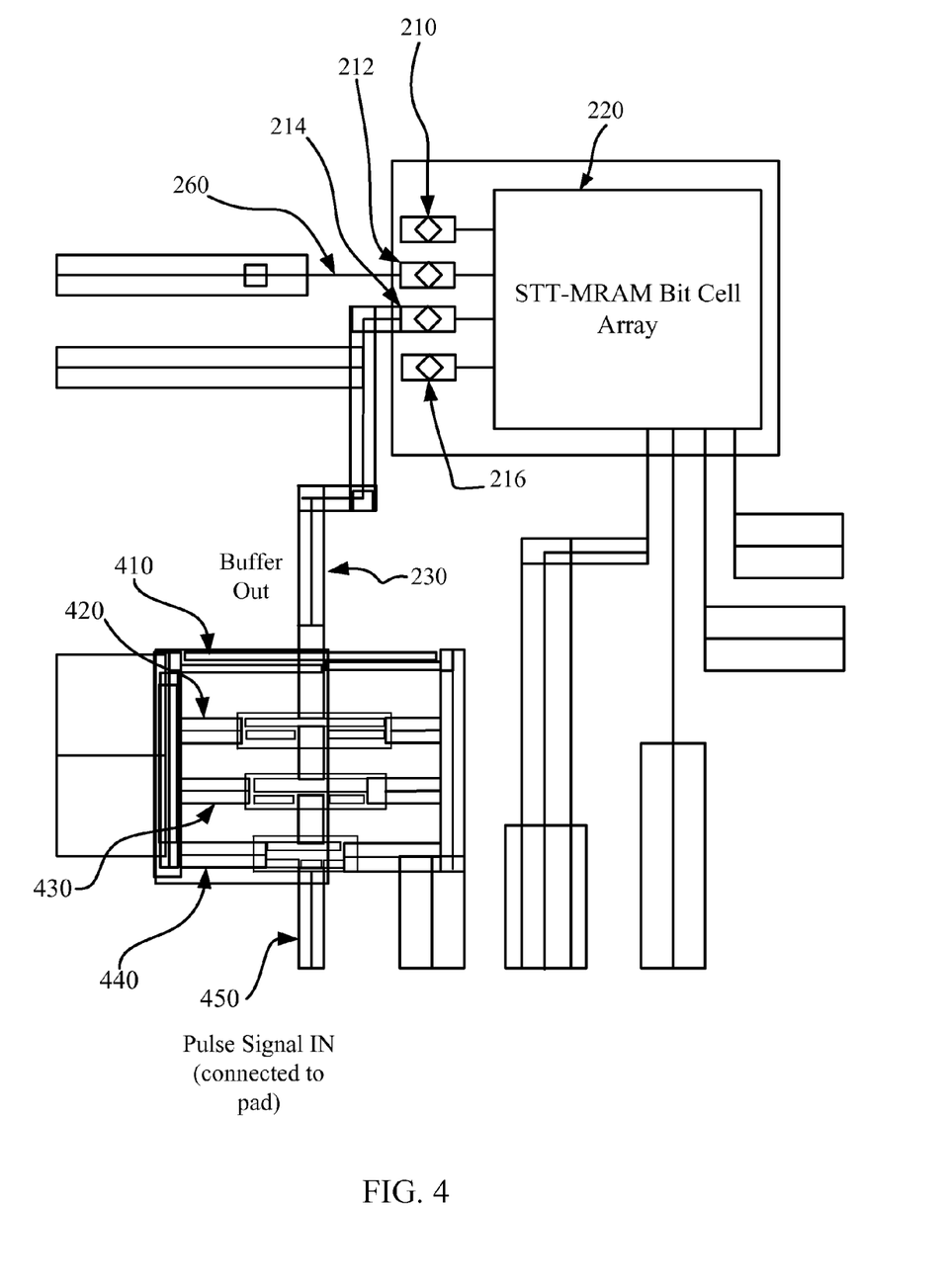
FIG. 4 is a top down layout of multi-stage buffers.

With reference to FIG. 4, a top down layout of multi-stage buffers according to an embodiment is shown. The exemplary multi-stage buffer can include a first buffer 410, second buffer 420, third buffer 430, and fourth buffer 440. The second buffer 420 can be, for example, twice as large as the first buffer 410, the third buffer 430 can be four times as large as the first buffer 410, and the fourth buffer 440 can be eight times as large as the first buffer 410. One of ordinary skill in the art will recognize that the number and size of buffers provided can be selected based on the capacitive load of the pad and the weakness or distortion of the pulse signal. Accordingly, other combinations of buffers, including different size and number of buffers, can be selected within the spirit and scope of the exemplary aspects based on these and other factors.

Figure 5:
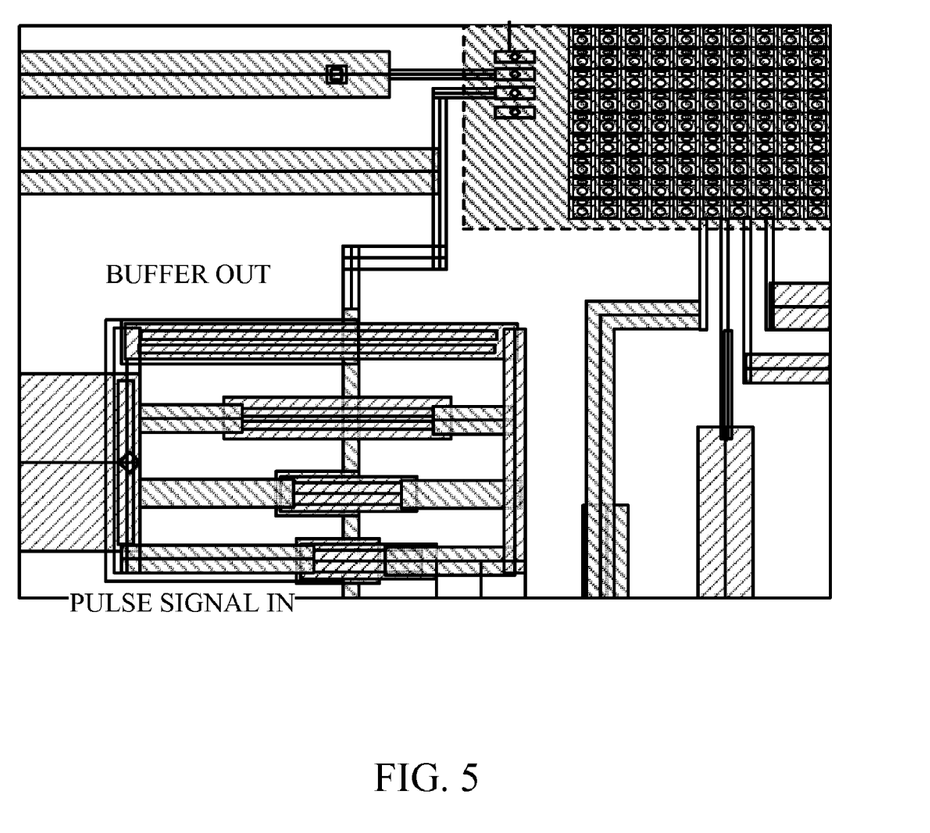
FIG. 5 is a screen view of a layout of a multi-stage buffers according to FIG. 4.
Figure 6:
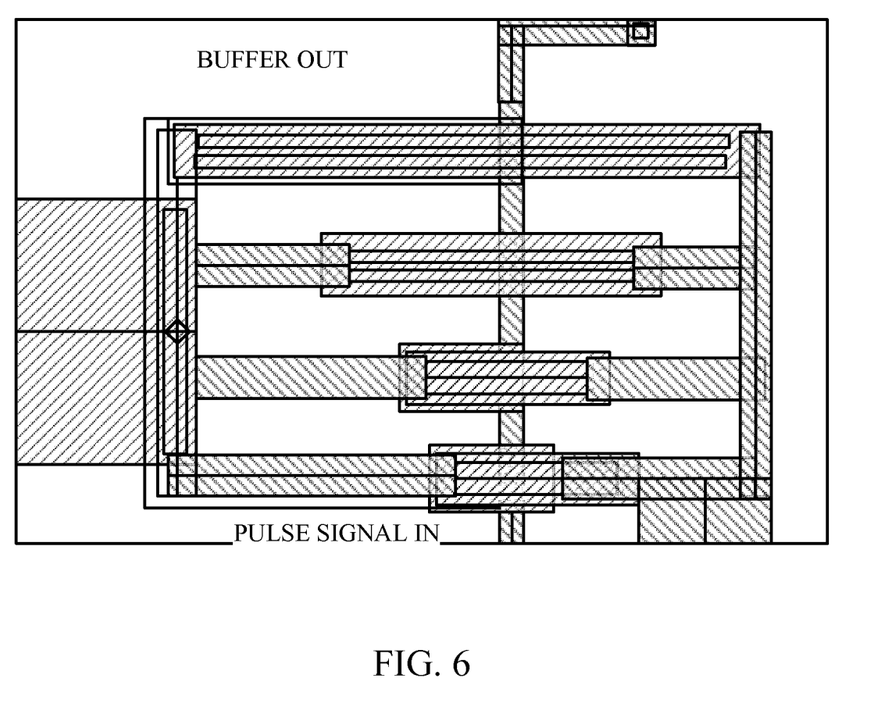
FIG. 6 is a screen view of a partial layout of the multi-stage buffers according to FIG. 5.

FIG. 5 is a screen view of a layout of a multi-stage buffer according to FIG. 4. FIG. 6 is a screen view of a partial layout of the multi-stage buffers according to FIG. 5.

As shown in FIGS. 4-6, each of the plurality of word lines 214 is coupled to a row of the plurality of STT-MRAM bit cells 220. With reference again to FIG. 1, each of the plurality of STT-MRAM bit cells includes a storage element and a word line transistor coupled to the storage element. The storage element can be a magnetic tunnel junction (MTJ). The word line transistor can be coupled in series with the MTJ. The STT-MRAM bit cell array also can include a sense amplifier having a first input coupled to a current source and a second input coupled to a bit line reference, and a plurality of read multiplexers, wherein each read multiplexer corresponds to one of the bit lines and is configured to selectively couple the corresponding one of the bit lines to the first input of the sense amplifier.

Figure 7:
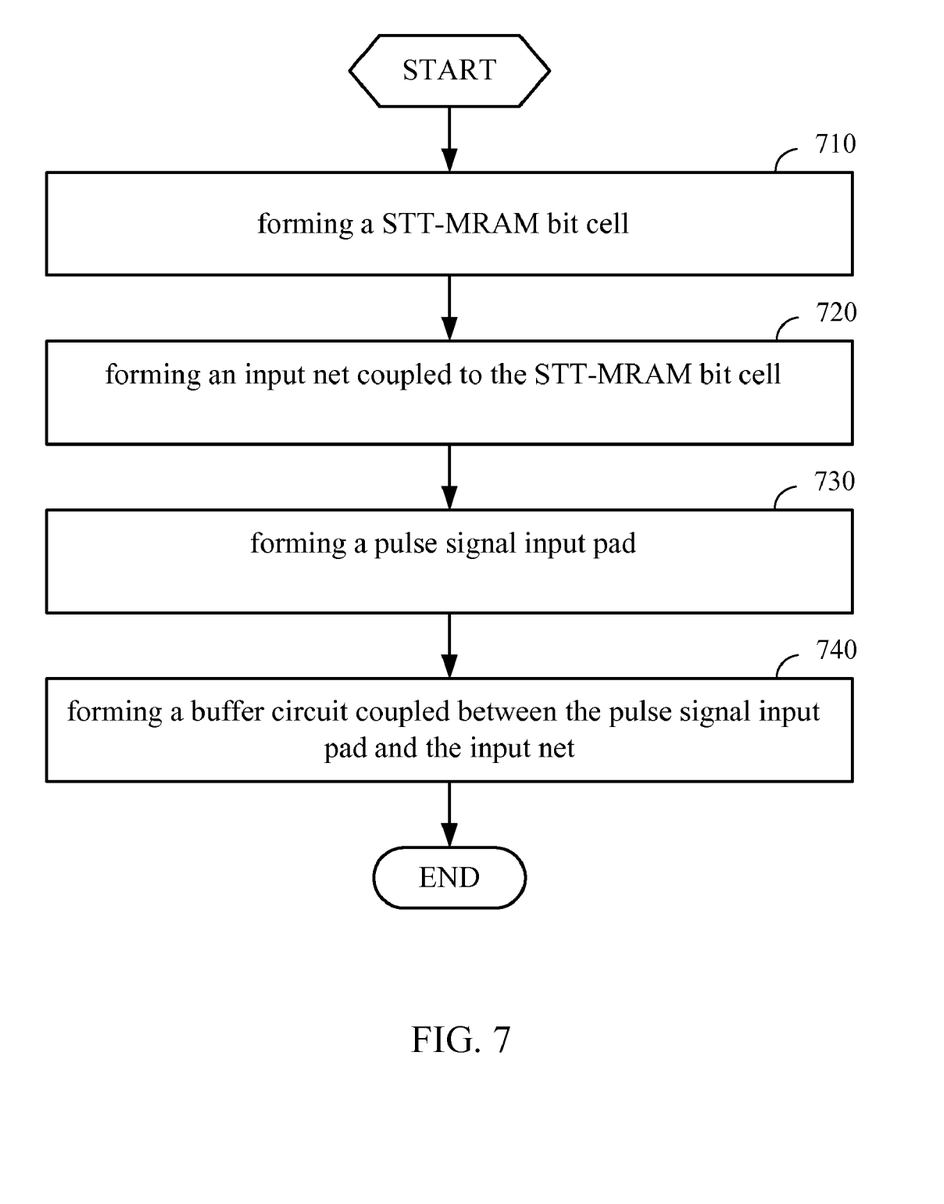
FIG. 7 is a flowchart showing an exemplary method of forming an STT-MRAM bit cell array.

As shown, for example, in FIG. 7, another exemplary aspect is directed to a method of forming a Spin Transfer Torque Magnetoresistive Random Access Memory (STT-MRAM) array. The method includes forming a STT-MRAM bit cell (710), forming an input net coupled to the STT-MRAM bit cell (720), forming a pulse signal input pad (730), and forming a buffer circuit coupled between the pulse signal input pad and the input net (740). The input net can be, for example, a bit line, a word line, or a source line. The buffer circuit can include, for example, a plurality of buffer circuits or a multi-stage buffer circuit.

As shown, for example, in FIGS. 2-7, an embodiment of a Spin Transfer Torque Magnetoresistive Random Access Memory (STT-MRAM) array can include a plurality of STT-MRAM bit cells, each coupled to one of a plurality of bit lines, word lines, and source lines, a pulse signal input pad. A buffer is coupled between the pulse signal input pad and an input net of an internal circuit of the plurality of STT-MRAM bit cells.

Exemplary aspects recognize that the high frequency behavior of the STT-MRAM bit cells, such as how fast the bit cell can switch and what kind of pulse is used to perform the switching, affects the performance of the memory. A fundamental property of the STT-MRAM bit cell array is that the pulse width is related to the read current and the write current. The write current is very much dependent on, or affected by, the pulse width. The pulse width also very much determines or affects the performance (e.g., speed) of the memory. Thus, the high frequency performance of the STT-MRAM bit cell array affects the overall performance of the STT-MRAM bit cell array.

According to the exemplary embodiments, a buffer circuit can be provided between the bonding pads and an input net of the STT-MRAM bit cell array in order to buffer the pulse signal supplied to the input net such that the affect of the parasitic capacitance of the pad can be substantially reduced or eliminated. The input net can be, for example, a word line and the pulse signal can be the read current supplied to the word line. Thus, the word line can be supplied with a pulse signal (e.g., a read current) having a strength that is effective for driving the internal circuitries of the STT-MRAM bit cell array.

It will be recognized that a buffer according to the exemplary aspects can be provided between the probing or bonding pads and any components of the internal circuitries, including for example, between the pads and the source lines, etc. For example, it also will be recognized that the source line normally is either high or low, and thus, can be held at a constant frequency. From a frequency-wise point of view, positioning a buffer between the pad and the source line may not be as important or as affective as positioning a buffer between the pad and the word line, since the word line is the switching frequency. Thus, for illustrative purposes only, the embodiments show a buffer positioned between the pad and a word line. However, the embodiments are not intended to be limited only to use with word lines.

According to the exemplary embodiments described, multi-stage buffers can be designed and placed between the pads and the input nets of the internal circuitries for improving pulse signal strengths and for improving impedance matching. The embodiments of bonding pad designs with buffers can significantly reduce the loading capacitance from the pad and improve the waveforms of the short pulse signals or high frequency signals. The embodiments of the bonding pads with buffers also can obtain better quality of signal transmission for short pulse signals or high frequency signals propagating from/to probing or bonding pads to/from the internal nets.

It will be appreciated that the embodiments can be used independently to reduce the impact of the parasitic capacitance of the probing or bonding pads. Moreover, one of ordinary skill in the art will recognize that the embodiments also can be used in conjunction with other techniques for reducing the capacitance of the probing or bonding pads, such as reducing the amount of metal in the pads, and thus, reducing the capacitance of the pads. For example, an exemplary aspect also recognizes that the signal distortion caused by the pad can be further reduced by reducing the capacitance of the pad. The technique of reducing the capacitance or loading of the pad can be combined with the present embodiments, which limit or reduce the affect of the loading affect from the pad and further enhance or strengthen the signal to drive the internal circuitries of the memory.

Accordingly, an exemplary aspect is directed to a Spin Transfer Torque Magnetoresistive Random Access Memory (STT-MRAM) array including a STT-MRAM bit cell, an input net coupled to the STT-MRAM bit cell, a pulse signal input pad, and a buffer circuit coupled between the pulse signal input pad and the input net of the STT-MRAM bit cell.

Another exemplary aspect is directed to a Spin Transfer Torque Magnetoresistive Random Access Memory (STT-MRAM) array includes a plurality of STT-MRAM bit cells, each coupled to one of a plurality of input nets, a pulse signal input pad, and a buffer circuit coupled between the pulse signal input pad and one of the plurality of input nets.

Yet another exemplary aspect is directed to a Spin Transfer Torque Magnetoresistive Random Access Memory (STT-MRAM) array includes a STT-MRAM bit cell, an input net coupled to the STT-MRAM bit cell, and a buffer circuit coupled to the input net. The buffer circuit is configured to receive a pulse signal from a pad and output a buffer signal to the input net.

A further exemplary aspect is directed to a method of forming a Spin Transfer Torque Magnetoresistive Random Access Memory (STT-MRAM) array. The method includes forming a STT-MRAM bit cell, forming an input net coupled to the STT-MRAM bit cell, forming a pulse signal input pad, and forming a buffer circuit coupled between the pulse signal input pad and the input net.

The foregoing disclosed devices and methods are typically designed and are configured into GDSII and GERBER computer files, stored on a computer readable media. These files are in turn provided to fabrication handlers who fabricate devices based on these files. The resulting products are semiconductor wafers that are then cut into semiconductor die and packaged into a semiconductor chip. The chips are then employed in devices described above.

Those of skill in the art will appreciate that the disclosed embodiments are not limited to illustrated exemplary structures or methods, and any means for performing the functionality described herein are included in the embodiments.

While the foregoing disclosure shows illustrative embodiments, it should be noted that various changes and modifications could be made herein without departing from the scope of the invention as defined by the appended claims. The functions, steps and/or actions of the method claims in accordance with the embodiments described herein need not be performed in any particular order. Furthermore, although elements of the embodiments may be described or claimed in the singular, the plural is contemplated unless limitation to the singular is explicitly stated.

What is claimed is:

1. A Spin Transfer Torque Magnetoresistive Random Access Memory (STT-MRAM) array comprising:
   a STT-MRAM bit cell;
   an input net coupled to the STT-MRAM bit cell;
   a pulse signal input pad; and
   a buffer circuit directly coupled between the pulse signal input pad and the input net of the STT-MRAM bit cell, wherein the buffer circuit comprises a multi-stage buffer comprising a plurality of buffer stages connected in series.

2. The STT-MRAM array of claim 1, wherein the input net is one of a bit line, a word line, and a source line.

3. The STT-MRAM array of claim 1, wherein the STT-MRAM bit cell includes a plurality of STT-MRAM bit cells, wherein the input net is a word line, and wherein the word line is coupled to a row of the plurality of STT-MRAM bit cells.

4. The STT-MRAM array of claim 1, wherein each of the buffer stages comprises one or more inverters.

5. The STT-MRAM array of claim 1, wherein the sizes of the buffer stages are unequal.

6. The STT-MRAM array of claim 5, wherein the size of the buffer stage closest to and directly coupled to the input net is smaller than the size of the buffer stage closest to and directly coupled to the pulse signal input pad.

7. The STT-MRAM array of claim 5, wherein the multi-stage buffer comprises a first buffer stage, a second buffer stage, a third buffer stage, and a fourth buffer stage, such that the size of the second buffer stage is two times the size of the first buffer stage, the size of the third buffer stage is four times the size of the first buffer stage, and the size of the fourth buffer stage is eight times the size of the first buffer stage.

8. The STT-MRAM array of claim 1, wherein the STT-MRAM bit cell comprises:
   a storage element; and
   a word line transistor coupled to the storage element.

9. The STT-MRAM array of claim 8, wherein the storage element is a magnetic tunnel junction (MTJ) and wherein the word line transistor is coupled in series with the MTJ.

10. The STT-MRAM array of claim 1, further comprising:
    a sense amplifier having a first input coupled to a current source and a second input coupled to a bit line reference; and
    a read multiplexer corresponding to a bit line of the STT-MRAM array, wherein the read multiplexer is configured to selectively couple the bit line to the first input of the sense amplifier.

11. The STT-MRAM array of claim 1 integrated in at least one semiconductor die.

12. The STT-MRAM array of claim 1, further comprising an electronic device, selected from the group consisting of a set top box, music player, video player, entertainment unit, navigation device, communications device, personal digital assistant (PDA), fixed location data unit, and a computer, into which the STT-MRAM array is integrated.

13. A Spin Transfer Torque Magnetoresistive Random Access Memory (STT-MRAM) array comprising:
    a plurality of STT-MRAM bit cells, each coupled to one of a plurality of input nets;
    a pulse signal input pad; and
    a buffer circuit directly coupled between the pulse signal input pad and the input net of the STT-MRAM bit cell, wherein the buffer circuit comprises a multi-stage buffer comprising a plurality of buffer stages connected in series.

14. The STT-MRAM array of claim 13, wherein the plurality of input nets is one of a plurality of bit lines, word lines, and source lines.

15. The STT-MRAM array of claim 13, wherein each of the buffer stages comprises one or more inverters.

16. The STT-MRAM array of claim 13, wherein the sizes of the buffer stages are unequal.

17. The STT-MRAM array of claim 13, wherein the plurality of input nets is a plurality of word lines, and
    wherein each of the plurality of word lines is coupled to a row of the plurality of STT-MRAM bit cells.

18. The STT-MRAM array of claim 13, wherein each of the plurality of STT-MRAM bit cells comprises:
    a storage element; and
    a word line transistor coupled to the storage element.

19. The STT-MRAM array of claim 18, wherein the storage element is a magnetic tunnel junction (MTJ) and wherein the word line transistor is coupled in series with the MTJ.

20. The STT-MRAM array of claim 13, further comprising:
    a sense amplifier having a first input coupled to a current source and a second input coupled to a bit line reference; and a plurality of read multiplexers, wherein each read multiplexer corresponds to a bit line of the STT-MRAM array and is configured to selectively couple the corresponding bit line to the first input of the sense amplifier.

21. The STT-MRAM array of claim 13 integrated in at least one semiconductor die.

22. The STT-MRAM array of claim 13, further comprising an electronic device, selected from the group consisting of a set top box, music player, video player, entertainment unit, navigation device, communications device, personal digital assistant (PDA), fixed location data unit, and a computer, into which the STT-MRAM array is integrated.

23. A Spin Transfer Torque Magnetoresistive Random Access Memory (STT-MRAM) array comprising:
a STT-MRAM bit cell;
an input net coupled to the STT-MRAM bit cell; and
a buffer circuit directly coupled to the input net,
wherein the buffer circuit is directly coupled to a pad, such that the buffer circuit is configured to receive a pulse signal from the pad and output a buffer signal to the input net, wherein the buffer circuit comprises a multi-stage buffer comprising a plurality of buffer stages connected in series.

24. The STT-MRAM array of claim 23, wherein the input net is one of a bit line, a word line, and a source line.

25. The STT-MRAM array of claim 23, wherein the sizes of the buffer stages are unequal.

26. The STT-MRAM array of claim 23 integrated in at least one semiconductor die.

27. The STT-MRAM array of claim 23, further comprising an electronic device, selected from the group consisting of a set top box, music player, video player, entertainment unit, navigation device, communications device, personal digital assistant (PDA), fixed location data unit, and a computer, into which the STT-MRAM array is integrated.

28. A method of forming a Spin Transfer Torque Magnetoresistive Random Access Memory (STT-MRAM) array, the method comprising:
forming a STT-MRAM bit cell;
forming an input net coupled to the STT-MRAM bit cell;
forming a pulse signal input pad; and
forming a buffer circuit directly coupled between the pulse signal input pad and the input net, wherein the buffer circuit comprises a multi-stage buffer comprising a plurality of buffer stages connected in series.

29. The method of claim 28, wherein the input net is one of a bit line, a word line, and a source line.

30. The method of claim 28, wherein the sizes of the buffer stages are unequal.

31. The method according to claim 28, wherein the STT-MRAM array is applied in an electronic device, selected from the group consisting of a set top box, music player, video player, entertainment unit, navigation device, communications device, personal digital assistant (PDA), fixed location data unit, and a computer, into which the STT-MRAM array is integrated.

32. A Spin Transfer Torque Magnetoresistive Random Access Memory (STT-MRAM) array comprising:
memory cell means for storing a polarized magnetic field;
pulse signal input means for transmitting a first pulse signal;
input net means for transmitting a second pulse signal to the memory cell means; and
buffering means directly coupled between the pulse signal input means and the input net means for receiving and buffering the first pulse signal from the pulse signal input means and outputting the second pulse signal to the input net means, wherein the buffering means comprises a multi-stage buffer comprising a plurality of buffer stages connected in series.

33. The STT-MRAM array of claim 32, wherein the input net means is one of a bit line, a word line, and a source line.

34. The STT-MRAM array of claim 32, wherein the memory cell means includes a plurality of memory cells,
wherein the input net means is a word line, and
wherein the word line is coupled to a row of the plurality of memory cells.

35. The STT-MRAM array of claim 32, wherein, each of the buffer stages comprises one or more inverters.

36. The STT-MRAM array of claim 32, wherein the sizes of the buffer stages are unequal.

37. The STT-MRAM array of claim 32, wherein the memory means comprises:
storage means for storing a polarized magnetic field; and
word line transistor means for switching a polarization of the storage means, the word line transistor means being coupled to the storage means.

38. The STT-MRAM array of claim 37, wherein the storage means is a magnetic tunnel junction (MTJ) and wherein the word line transistor means is coupled in series with the MTJ.

39. The STT-MRAM array of claim 32, further comprising:
sense amplifying means for amplifying a signal, the sense amplifying means having a first input coupled to a current source and a second input coupled to a bit line reference; and
read multiplexing means, which corresponds to a bit line of the STT-MRAM array, for selectively coupling the bit line to the first input of the sense amplifying means.

40. The STT-MRAM array of claim 32 integrated in at least one semiconductor die.

41. The STT-MRAM array of claim 32, further comprising an electronic device, selected from the group consisting of a set top box, music player, video player, entertainment unit, navigation device, communications device, personal digital assistant (PDA), fixed location data unit, and a computer, into which the STT-MRAM array is integrated.

42. A method of forming a Spin Transfer Torque Magnetoresistive Random Access Memory (STT-MRAM) array, the method comprising:
step for forming a STT-MRAM bit cell;
step for forming an input net coupled to the STT-MRAM bit cell;
step for forming a pulse signal input pad; and
step for forming a buffer circuit directly coupled between the pulse signal input pad and the input net, wherein the buffer circuit comprises a multi-stage buffer comprising a plurality of buffer stages connected in series.

43. The method of claim 42, wherein the input net is one of a bit line, a word line, and a source line.

44. The method of claim 42, wherein the sizes of the buffer stages are unequal.

45. The method according to claim 42, wherein the STT-MRAM array is applied in an electronic device, selected from the group consisting of a set top box, music player, video player, entertainment unit, navigation device, communications device, personal digital assistant (PDA), fixed location data unit, and a computer, into which the STT-MRAM array is integrated.

* * * * *